US011802904B2

(12) United States Patent
Shiota et al.

(10) Patent No.: US 11,802,904 B2
(45) Date of Patent: Oct. 31, 2023

(54) ELECTRONIC COMPONENT TESTING APPARATUS, SOCKETS, AND REPLACEMENT PARTS FOR ELECTRONIC COMPONENT TESTING APPARATUS

(71) Applicant: ADVANTEST Corporation, Tokyo (JP)

(72) Inventors: Natsuki Shiota, Tokyo (JP); Hiroyuki Mineo, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 120 days.

(21) Appl. No.: 17/104,913

(22) Filed: Nov. 25, 2020

(65) Prior Publication Data

US 2021/0190855 A1 Jun. 24, 2021

(30) Foreign Application Priority Data

Dec. 24, 2019 (JP) ................. 2019-232547

(51) Int. Cl.
 *G01R 31/30* (2006.01)
 *G01R 31/28* (2006.01)
 (Continued)

(52) U.S. Cl.
 CPC ......... *G01R 31/2863* (2013.01); *G01R 29/10* (2013.01); *G01R 31/2822* (2013.01); *G01R 31/2867* (2013.01)

(58) Field of Classification Search
 CPC .... G01R 31/02; G01R 31/28; G01R 31/2863; G01R 31/2867; G01R 31/30;
 (Continued)

(56) References Cited

U.S. PATENT DOCUMENTS 11,092,643 B2 * 8/2021 Trotta ................ G01R 31/2822
2006/0194553 A1 8/2006 Ozaki et al.
(Continued)

FOREIGN PATENT DOCUMENTS

JP 2008518567 A 5/2008
TW 200928382 A 7/2009
WO 2014/136159 A1 9/2014

OTHER PUBLICATIONS

Office Action issued in corresponding Taiwanese Patent Application No. 109139881 dated Sep. 13, 2021 (10 pages).
(Continued)

*Primary Examiner* — Neel D Shah
(74) *Attorney, Agent, or Firm* — Osha Bergman Watanabe & Burton LLP

(57) ABSTRACT

An electronic component testing apparatus is used for testing a device under test (DUT). The electronic component testing apparatus includes: a socket unit that is electrically connected to the DUT; a first wiring board; and a tester that comprises a test head in which the first wiring board is mounted. The socket unit includes a first socket and a second socket. The second socket includes a base and a test antenna unit. The tester tests the DUT by transmitting and receiving radio waves between a device antenna unit of the DUT and the test antenna unit while the DUT is electrically connected to the first socket and the first socket is electrically connected to the test head through the second socket.

16 Claims, 15 Drawing Sheets

(51) Int. Cl.
*G01R 29/10* (2006.01)
*G01R 1/04* (2006.01)
*G01R 1/067* (2006.01)
*G01R 1/073* (2006.01)

(58) Field of Classification Search
CPC .... G01R 31/302; G01R 31/303; G01R 29/10; G01R 1/04; G01R 1/067; G01R 1/073
See application file for complete search history.

(56) References Cited

U.S. PATENT DOCUMENTS

| | | | |
|---|---|---|---|
| 2009/0153158 A1* | 6/2009 | Dunn | G01R 31/2822 |
| | | | 324/762.01 |
| 2010/0273433 A1 | 10/2010 | Ozaki et al. | |
| 2013/0231060 A1 | 9/2013 | Ozaki et al. | |
| 2016/0025788 A1 | 1/2016 | Fujita et al. | |
| 2018/0299488 A1 | 10/2018 | Jordan et al. | |
| 2019/0310314 A1* | 10/2019 | Liu | H01Q 1/2283 |

OTHER PUBLICATIONS

Office Action issued in counterpart Japanese Patent Application No. JP 2019-232547 A, dated Jul. 4, 2023 (5 pages).

* cited by examiner

ELECTRONIC COMPONENT TESTING APPARATUS, SOCKETS, AND REPLACEMENT PARTS FOR ELECTRONIC COMPONENT TESTING APPARATUS

CROSS-REFERENCE TO RELATED APPLICATIONS

This application claims priority from Japanese Patent Application No. 2019-232547 filed on Dec. 24, 2019. The contents described and/or illustrated in the documents relevant to the Japanese Patent Application No. 2019-232547 are incorporated herein by reference as a part of the description and/or drawings of the present application.

BACKGROUND

Technical Field

The present invention relates to an electronic component testing apparatus used in the test of the electronic component under test (DUT: Device Under Test) which has an antenna, and relates to a socket and a replacement component for the electronic component test apparatus.

Description of the Related Art

As a method of determining radiation performance characteristics of a wireless device, a method of measuring a signal from the wireless device which is attached to an attachment mechanism in a far field anechoic chamber, is known (for example, see in Patent Document 1).

PATENT DOCUMENT

Patent Document 1: JP 2008-518567 A

As the OTA (Over The Air) test of wireless devices, a test in near-field may be performed instead of the test in far-field as described above.

SUMMARY

One or more embodiments of the present invention provide an electronic component testing device, sockets, and replacement components capable of performing the OTA test on a near-field.

[1] One or more embodiments of the present invention provide an electronic component testing apparatus for testing a DUT which has a device antenna (i.e., device antenna unit) and a terminal which is formed on a first main surface of the DUT including a socket (i.e., socket unit) which is to be electrically connected to the DUT, a first wiring board, and a tester which has a test head in which the first wiring board is mounted. The socket includes a first socket which is disposed to face the first main surface and is to be electrically connected to the DUT and a second socket which is mounted on the first wiring board. The second socket is to contact the second main surface opposite to the first main surface of the DUT and is to be electrically connected to the first socket. The second socket includes a base which is to contact the second main surface of the DUT and a test antenna I.e., test antenna unit)) which is electrically connected to the tester and disposed to face the device antenna. The tester tests the DUT by transmitting and receiving radio waves between the device antenna and the test antenna in a state in which the DUT and the first socket are electrically connected to each other and the first socket is electrically connected to the test head through the second socket.

[2] One or more embodiments of the present invention provide an electronic component test apparatus for testing a DUT which has a device antenna and a terminal which is formed on a first main surface of the DUT including a socket which is to be electrically connected to the DUT, a first wiring board which has a first opening (i.e., board opening), and a tester which has a test head in which the first wiring board is mounted. The socket includes a first socket which is disposed so as to face the first main surface, is to be electrically connected to the DUT and is the first wiring board, and a second socket which is exposed from the first wiring board through the first opening and is to contact the second main surface opposite to the first main surface of the DUT. The second socket includes a base which is to contact the second main surface of the DUT and a test antenna which is electrically connected to the tester and disposed to face the device antenna. The tester tests the DUT by transmitting and receiving radio waves between the device antenna and the test antenna in a state in which the DUT and the first socket are electrically connected to each other and the first socket is electrically connected to the test head through the first wiring board.

[3] In one or more embodiments, the second socket may include a first attenuation member (i.e., first attenuation sheet) which attenuates radio waves radiated from the device antenna or the test antenna. The first attenuation member may be interposed between the test antenna and the device antenna.

[4] In one or more embodiments, the device antenna may include a first device antenna provided on the second main surface. The test antenna may include a first test antenna disposed to face the first device antenna. The base may have a second opening (i.e., base opening) through which first test antenna faces the first device antenna.

[5] In one or more embodiments, the first attenuation member may be provided in the second opening to be interposed between the first test antenna and the device antenna.

[6] In one or more embodiments, the second socket may include a second attenuating member which is provided on the inner surface of the second opening and attenuates radio waves radiated from the first device antenna or the first test antenna The second socket may include a shield layer which is provided on the outer surface of the base, shielding radio waves from the outside.

[7] In one or more embodiments, the first test antenna may be a patch antenna which includes a substrate, a radiating element (i.e., radiator) provided on the substrate, a wiring pattern which is provided on the substrate and connected to the radiating element.

[8] In one or more embodiments, the first test antenna may include a plurality of said radiating elements which is provided in a matrix on the substrate, and one of the wiring pattern connected to the plurality of radiating elements.

[9] In one or more embodiments, the first test antenna may include a plurality of the radiating elements which is provided in a matrix on the substrate, and a plurality of wiring patterns respectively which is connected to the plurality of radiating elements.

[10] In one or more embodiments, the device antenna may include a second device antenna which is provided on the side of the DUT. The test antenna may include a second test antenna which is disposed so as to face the second device antenna the second test antenna may be disposed in a direction substantially parallel to the first main surface with respect to the DUT.

[11] In one or more embodiments, the electronic component testing apparatus may include an electronic component handling device which holds and moves the DUT and having a moving device capable of relatively pressing the DUT to the socket.

[12] In one or more embodiments, the moving device may include a holding portion (i.e., holder) which has an adsorption mechanism for holding the DUT. The first socket may be attached to the tip of the holding portion.

[13] In one or more embodiments, the first socket may include a first connecting portion electrically connectable with the terminal of the DUT, a first conductive path whose one end is connected to the first connecting portion, and a second connecting portion which is connected to the other end of the first conductive path. The second socket may include a third connecting portion electrically connectable with the second connecting portion of the first socket. The first wiring board may include a fourth connecting portion electrically connectable with the third connecting portion of the base portion and a third conductive path which connected to the fourth connecting portion. The third conductive path may be electrically connected to the test head.

[14] In one or more embodiments, the first socket may include a body and a third wiring board to which the body is attached. The first connecting portion may be a first pogo pin. The body may include a first holding hole into which the first pogo pin is inserted and may hold the first pogo pin. The first conductive path may include a first wiring pattern which is formed on the third wiring board. The second connecting portion may be a first pad which provided at one end of the first wiring pattern. The third connecting portion may be a second pogo pin electrically connectable to the first pad. The base may have a second holding hole into which the second pogo pin is inserted and may hold the second pogo pin.

[15] In one or more embodiments, the test antenna may be fixed to the base.

[16] In one or more embodiments, the first socket may include a first connecting portion electrically connectable with the terminal of the DUT, a first conductive path whose one end is connected to the first connecting portion, and a second connecting portion which is connected to the other end of the first conductive path. The first wiring board may include the second connecting portion of the first socket and electrically connectable fourth connecting portion and a third conductive path which is connected to the fourth connecting portion. The third conductive path may be electrically connected to the test head.

[17] In one or more embodiments, the first socket may include a body and a third wiring hoard to which the body is attached. The first connection portion may be a first pogo pin, the body may have a first holding hole into which the first pogo pin is inserted and hold the first pogo pin. The first conductive path may include a first wiring pattern which is formed on the third wiring board. The second connection portion may be a third pogo pin, the body may have a third holding hole into which the third pogo pin is inserted and hold the third pogo pin. The fourth connection portion may a second pad which is formed on the first wiring board and electrically connectable to the third pogo pin.

[18] In one or more embodiments, the test antenna may be fixed to the base.

[19] One or more embodiments of the present invention provide a socket which is used for testing DUT which has a device antenna and a terminal which is formed on a first main surface including a first socket which is disposed so as to face the first main surface and which is to be electrically connected to the DUT, and a second socket which is to be contact a second main surface opposite to the first major surface of the DUT and is to be electrically connected to the first socket. The second socket includes a base which is to contact the second main surface of the DUT and a test antenna which is disposed to face the device antenna.

[20] One or more embodiments of the present invention provide a socket which is used for testing a DUT which has a device antenna and a terminal which is formed on a first main surface including a first socket which is disposed so as to face the first main surface and which is to be electrically connected to the DUT, a second socket which is to be contact a second main surface opposite to the first main surface of the DUT, and a first wiring hoard which has a first opening which exposes the second socket and is to be electrically connected to the first socket. The second socket includes a base which is contacts the second main surface of the DUT and a test antenna which is disposed to face the device antenna.

[21] in one or more embodiments, die second socket may include a first attenuation member which attenuates radio waves radiated from the device antenna or the test antenna. The first attenuation member may be interposed between the test antenna and the device antenna.

[22] in one or more embodiments, the device antenna may include a first device antenna which is provided on the second main surface, the test antenna may include a first test antenna disposed so as to face the first device antenna. The base portion may have a second opening through which the first test antenna faces the first device antenna.

[23] In one or more embodiments, the first attenuation member may be provided in the second opening to be interposed between the first test antenna and die device antenna.

[24] In one or more embodiments, the second socket may include a second attenuating member which is provided on the inner surface of the second opening and attenuates radio waves radiated from the first device antenna or the first test antenna and a shield layer which is provided on the outer surface of the base and shields radio waves from the outside.

[25] In one or more embodiments, the first test antenna may be a patch antenna which includes a substrate, a radiating element (i.e., radiator) which is provided on the second substrate, and a wiring pattern which is connected to the radiating element.

[26] In one or more embodiments, the first test antenna may include a plurality of the radiating elements which is provided in a matrix on the substrate, and one of the wiring pattern which is connected to the plurality of radiating elements.

[27] In one or more embodiments, the first test antenna may include a plurality of the radiating elements which is provided in a matrix on the substrate, and a plurality of wiring patterns which is respectively connected to the plurality of radiating elements.

[28] In one or more embodiments, the device antenna may include a second device antenna which is provided on the side of the DUT. The test antenna may include a second test antenna which is disposed to face the second device antenna. The second test antenna may be disposed in a direction substantially parallel to the first main surface with respect to the DUT.

[29] One or more embodiments of the present invention provide a replacement component which is used for testing a DUT which has a device antenna and a terminal which is formed on a first main surface including a base which contacts the DUT with a second main surface opposite to the first main surface and a first test antenna which is disposed so as to face the device antenna. The base is a replacement component which has a second opening through which the first test antenna faces to the first device antenna.

[30] In one or more embodiments, the replacement component may include a first attenuation member which attenuates radio waves radiated from the device antenna or the first test antenna. The first attenuation member may be provided in the second opening to be interposed between the test antenna and the device antenna.

[31] In one or more embodiments, the replacement component may include a second attenuation member (i.e., second attenuation sheet) which is provided on the inner surface of the second opening and attenuates radio waves radiated from the first device antenna or the first test antenna, and a shield layer which is provided on the outer surface of the base and shields radio waves from the outside.

[32] In one or more embodiments, the first test antenna may be a patch antenna that include a substrate, a radiating element (i.e., radiator) which is provided on the substrate, a wiring pattern which is provided on the substrate and connected to the radiating element.

[33] In one or more embodiments, the first test antenna may include a plurality of the radiating elements which is provided in a matrix on the substrate, and one of the wiring pattern which is connected to the plurality of radiating elements.

[34] In one or more embodiments, the first test antenna may include a plurality of the radiating elements which is provided in a matrix on the substrate, and a plurality of wiring patterns which is respectively connected to the plurality of radiating elements.

[35] In one or more embodiments, the device antenna may include a second device antenna which is provided on the side of the DUT. The test antenna may include a second test antenna which is disposed to face the second device antenna. The second test antenna may be disposed in a direction substantially parallel to the first main surface with respect to the DUT.

In one or more embodiments of the present invention, the second socket, which is to contact the second main surface of the DUT, includes a test antenna disposed to face the device antenna of the DUT. Contacting of the second main surface of the DUT with the base of the second socket positions the device antenna and the test antenna such that radio waves from the device antenna reach the test antenna in near-field. This allows to perform the OTA test at near-field.

DETAILED DESCRIPTION

Hereinafter, embodiments of the present invention will be Described with reference to the drawings.

The First Embodiment

Figure 1:
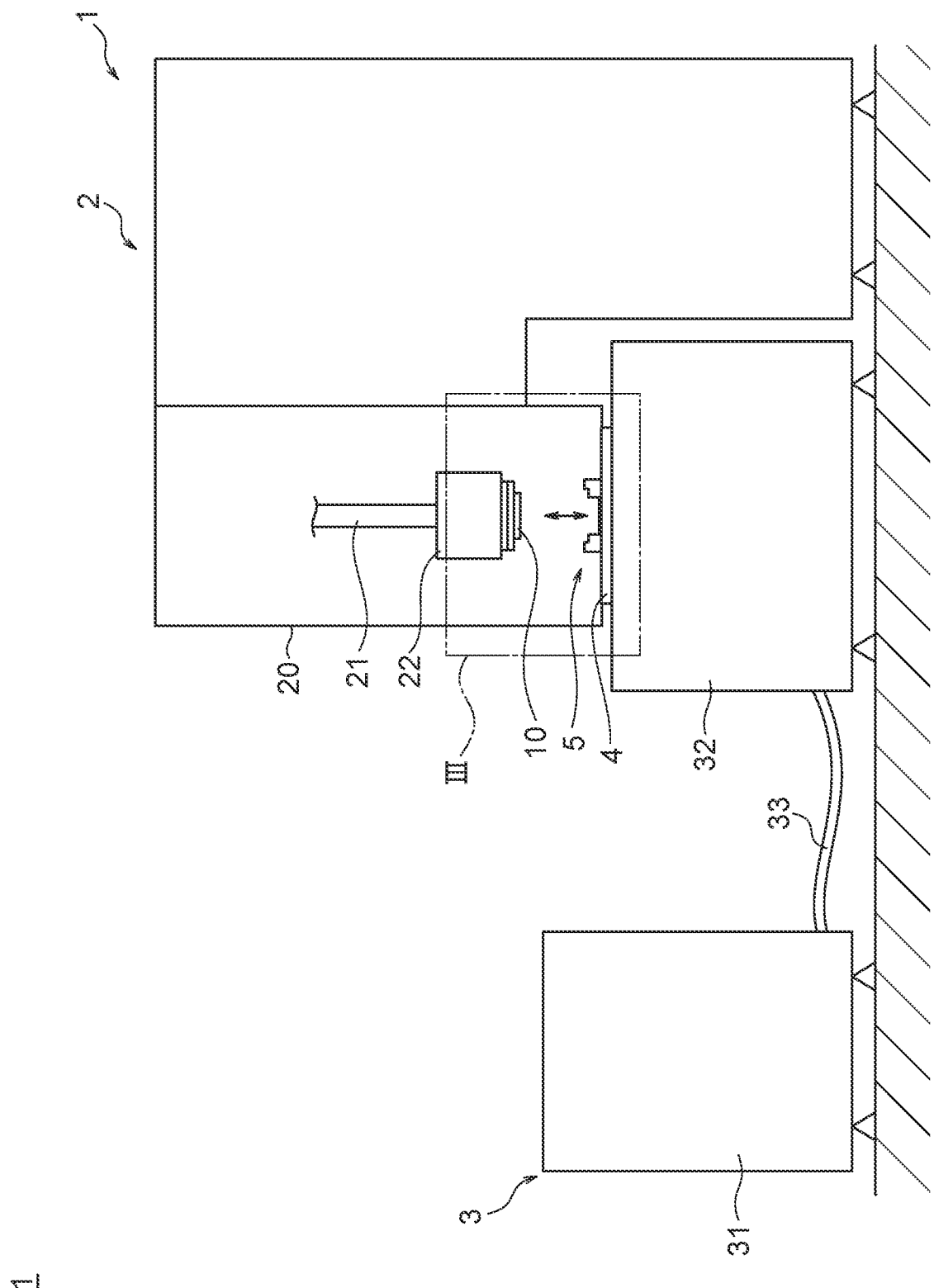
FIG. 1 is a schematic cross-sectional view showing an overall configuration of an electronic component testing apparatus according to the first embodiment of the present invention.

FIG. 1 is a schematic cross-sectional view showing the overall configuration of the electronic component testing apparatus according to the present embodiment.

An electronic component testing apparatus 1 in the present embodiment is an apparatus for performing an OTA test of the DUT having a device antenna. This testing apparatus 1 tests the radio wave radiation characteristics of the DUT 10 which includes the device antenna 12. For the test of radiation characteristics, a test antenna 73 (to be described later) receives radio waves (so-called millimeter waves) with a frequency of 24.250 to 52,600 GHz, which are radiated from the DUT 10, in the near-field. The testing apparatus 1 also tests the radio wave reception characteristics of the DUT 10. For the test of reception characteristics, the DUT 10 receives the millimeter waves, which are radiated from the test antenna 73, in the near-field.

The DUT 10 to the tested is a so-called AiP (Antenna in Package) device. The DUT 10 includes a device antenna 12 formed on the lower surface 11b of the substrate 11, a semiconductor chip 13 mounted on the lower surface 11b of the substrate 11, and input-output terminals 14 formed on the upper surface 11a of the substrate 11 (refer to FIG. 2). The semiconductor chip 13 is a device for controlling the transmission and reception of the device antenna 12. Specific examples of device antennas 12 may include patch antennas, dipole antennas, and Yagi antennas. Although not particularly shown, the semiconductor chip 13 may be mounted on the upper surface 11a of the substrate 11.

The DUT 10 in the present embodiment corresponds to an example of "DUT," the device antenna 12 in the present embodiment corresponds to an example of "first device antenna," the input-output terminals 14 in the present embodiment corresponds to an example of "terminal," the upper surface 11a in the present embodiment corresponds to an example of "first main surface," the lower surface 11b in the present embodiment corresponds to an example of "second main surface," in this disclosure.

As shown in FIG. 1, the testing apparatus 1 according to the present embodiment includes a handler 2 for moving the DUT 10, a tester 3 for performing the DUT 10 test, a load board 4 mounted on a test head 32 (to be described later) of the tester 3, and a socket 5 mounted on the load board 4 and electrically connectable to the DUT 10. The handler 2 press the DUT 10 against the socket 5 and electrically connect the DUT 10 to the tester 3. The tester 3 performs the following test on the DUT 10. First, the tester 3 tests radio waves radiation characteristics of the DUT 10. The tester 3 sends a test signal to the DUT 10 through the socket 5, radiating radio waves from the device antenna 12 of the DUT 10, and receiving the radio waves at the test antenna 73 (described later) of the socket 5. Next, the tester 3 test the radio waves reception characteristics of the DUT 10 by radiating radio waves from the test antennas 73 and receiving the radio waves at the DUT 10.

The electronic component testing apparatus 1 in the present embodiment corresponds to an example of the "electronic component testing apparatus," the handler 2 in the present embodiment corresponds to an example of the "electronic component handling apparatus," the tester 3 in the present embodiment corresponds to an example of the "tester," the load board 4 in the present embodiment corresponds to an example of the "first wiring board," and the socket 5 in the present embodiment corresponds to an example of the "socket," in this disclosure.

The handler 2 includes, as shown in FIG. 1, a thermostatic chamber 20 and a contact arm 21. The handler 2 has a laterally projecting portion, and the thermostatic chamber 20 is accommodated in the projecting portion, and a test head 32 is disposed in a space below the projecting portion. That is, the chamber 20 is disposed above the test head 32. The socket 5 is disposed in the chamber 20 through an opening formed in the bottom of the chamber 20. The chamber 20 applies a temperature of high or low temperature to the DUT 10 disposed in the socket 5. Although not particularly limited, the temperature of the chamber 20 may be adjustable in the range of −55° C. to +155° C. The contact arm 21 in the present embodiment corresponds to an example of the "moving device" in this disclosure.

The contact arm 21 is a device for moving the DUT 10 and is supported by rails (not shown) included in the handler 2. The contact arm 21 includes an actuator for horizontal movement (not shown) and can move back and forth and left and right according to the rail. Further, the contact arm 21 includes an actuator for vertical movement (not shown) and can in the vertical direction. The contact arm 21 is includes a contact chuck 22 attached to the distal end of the contact arm 21. The contact arm 21 can move while holding the DUT 10. The contact chuck 22 in the present embodiment corresponds to an example of the "holding portion" or "holder" in this disclosure.

Figure 2:
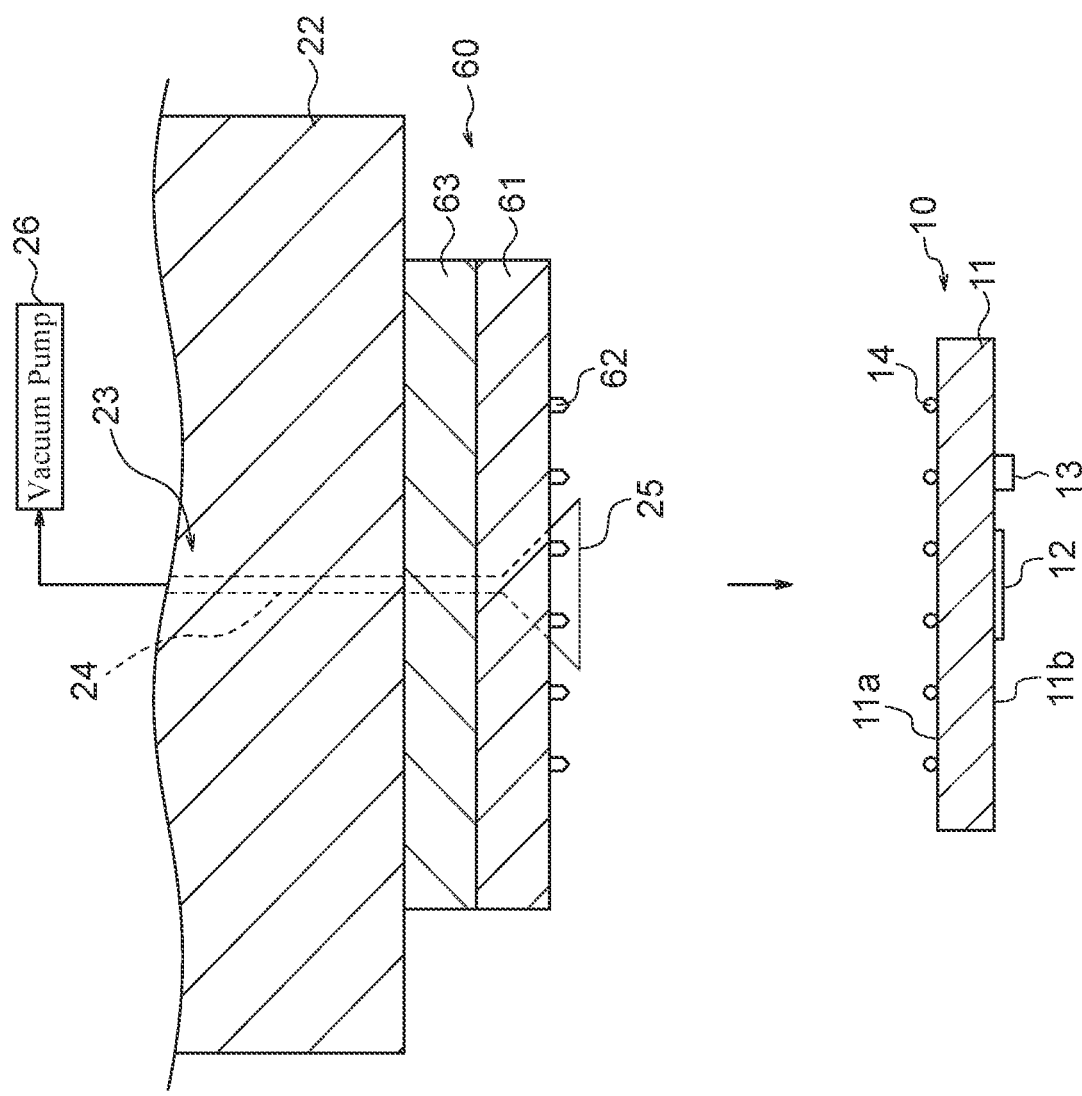
FIG. 2 is a cross-sectional view showing a contact chuck in the first embodiment of the present invention and shows before the contact chuck contacts the DUT.

FIG. 2 is a cross-sectional view showing a contact chuck according to the present embodiment and shows before the contact chuck contacts the DUT.

The contact chucks 22 includes, as shown in FIG. 2, a suction mechanism 23 for holding the DUT 10 by suction. The suction mechanism 23 includes a suction pipe 24, a suction pad 25, and a vacuum pump 26. The suction pipe 24 is formed along the vertical direction inside the top socket 60, which is mounted to the tip of the contact chuck 22 (described later). One end of the suction pipe 24 is in communication with the suction pad 25. The other end of the suction pipe 24 is connected to a vacuum pump 26. The suction pad 25, which is in communication with the suction pipe 24, is open at the lower surface of the top socket 60. The suction mechanism 23 in this embodiment corresponds to an example of an "adsorption mechanism" in this disclosure.

When the contact chuck 22 holds the DUT 10, the contact chuck 22 moves right above the DUT 10 by the contact arm 21, as shown in FIG. 2. Next, the suction pad 25 contacts the DUT 10 by the contact arm 21. This forms a sealed space surrounded by the suction pad 25 and the DUT 10. At this time, the suction pad 25 contacts a flat portion of the upper surface 11a of the DUT 10 where the input-output terminal 14 is not formed. The vacuum pump 26 sucks the air in the sealed space through the suction pipe 24, the contact chuck 22 holds the DUT 10.

The tester 3 includes, as shown in FIG. 1, a main frame 31 and a test head 32. The main frame 31 is connected to the test head 32 via a cable 33. The main frame 31 sends test signals to the DUT 10 through the test head 32 to test the DUT 10 and evaluates the DUT 10 according to the test result.

The test head 32 is connected to the main frame 31 via the cable 33 and sends test signals to the DUT 10 during the test. The test head 32 includes the pin electronics cards inside (not shown), which is electrically connected to the socket 5.

The load board 4 is a wiring board mounted on the test head 32 and is electrically connected to the test head 32 as shown in FIG. 1. The load board 4 includes conductive paths 41 and pads 42. The conductive paths 41 connect electrically the test head 32 to the socket 5. The pads 42 are provided at the end of the conductive paths 41 (see FIG. 5). Test signals sent from the tester 3 is sent to the DUT to 10 through the conductive paths 41. The conductive paths 41 include wiring patterns and through holes.

Figure 3:
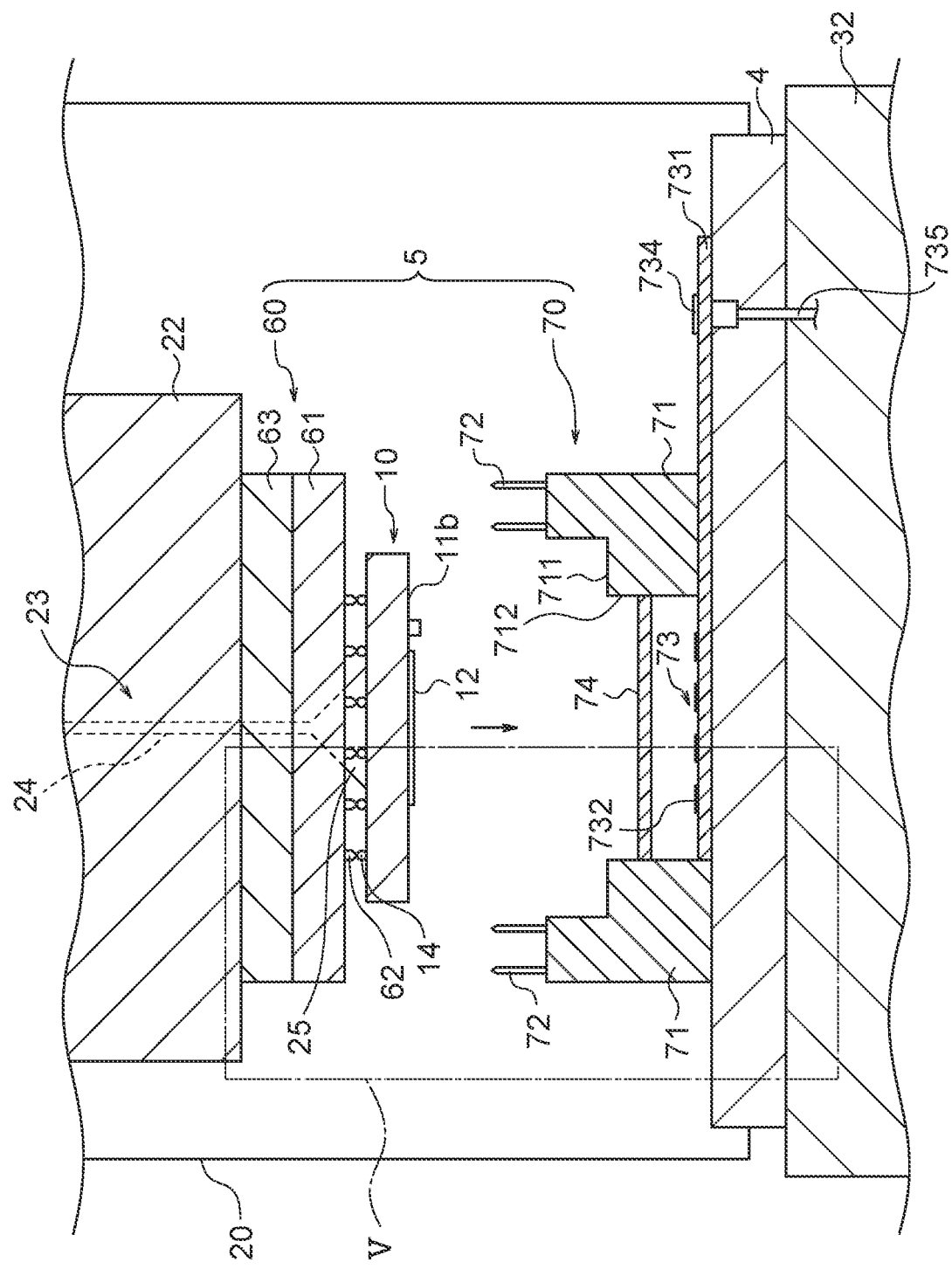
FIG. 3 is an enlarged cross-sectional view of a part III of FIG. 1 showing before pressing the DUT to the socket according to the first embodiment of the present invention.
Figure 4:
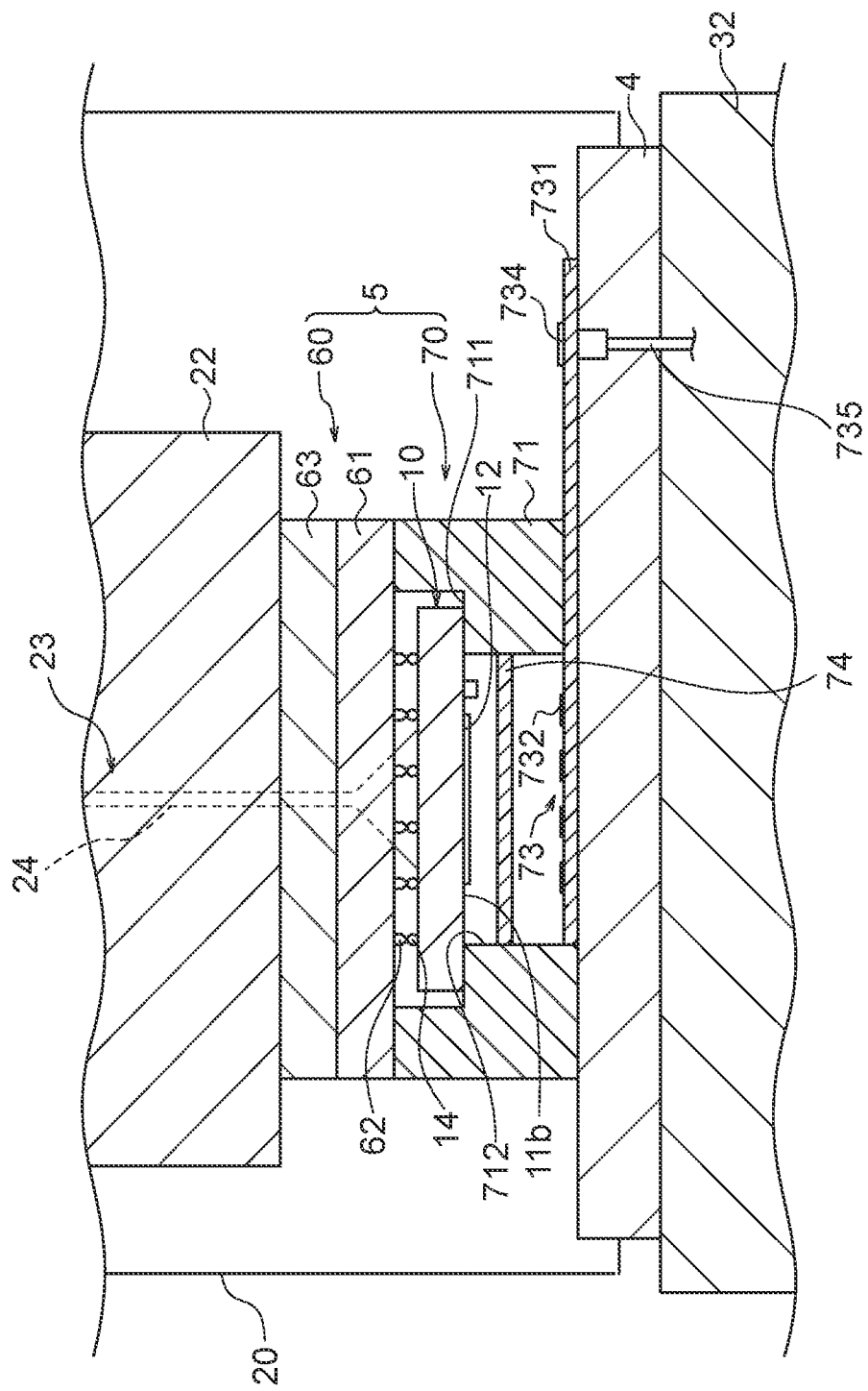
FIG. 4 shows pressing the DUT to the socket according to the first embodiment of the present invention and corresponds to FIG. 3.
Figure 5:
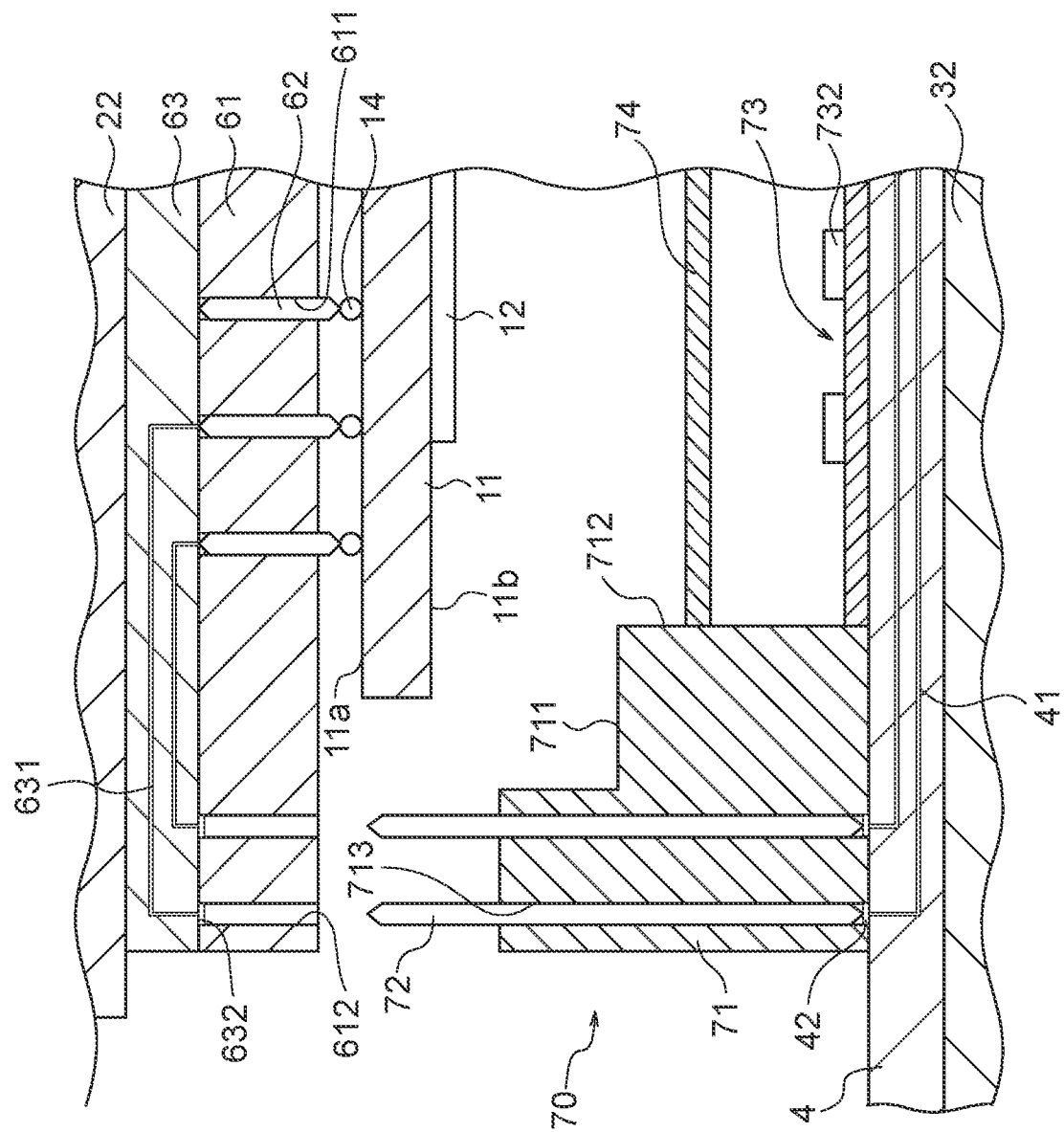
FIG. 5 is an enlarged sectional view of the V portion of FIG. 3.

FIG. 3 is an enlarged sectional view of the III portion of FIG. 1 showing before pressing the DUT to the socket in the present embodiment, FIG. 4 shows pressing the DUT the socket according to the present embodiment and corresponds to FIG. 3, FIG. 5 is an enlarged sectional view of the V portion of FIG. 3.

The socket 5, as shown in FIG. 3, includes the top socket 60 mounted to the contact chuck 22, and a bottom socket 70 mounted to the load board 4. As shown in FIG. 4, contacting of the top socket 60 held in the contact chuck 22 with the bottom socket 70 allows the electrical connection of the top socket 60 with the bottom socket 70. The top socket 60 is detachably fixed to the contact chuck 22 by screwing or the like. The bottom socket 70 is also detachably fixed to the load board 4 by screwing or the like. The top socket 60 and the bottom socket 70 are replaced in accordance with a change in the type of the DUT 10. The top socket 60 in the present embodiment corresponds to an example of the "first socket," and the bottom socket 70 in the present embodiment corresponds to an example of the "second socket," in this disclosure.

The top socket 60 includes a body 61, pogo pins 62, and a wiring board 63. The body 61 is fixed to the wiring board 63. The wiring board 63, for example, is fixed to the body 61 by screwing.

The pogo pins 62, as shown in FIG. 5, are disposed inside holding holes 611 formed in the body 61 and are held in the body 61 by the holes 611. Connecting the pogo pins 62 to the terminals 14 of the DUT 10 makes the connection of the DUT 10 with the testing apparatus 1.

The wiring board 63 includes conductive paths 631 electrically connected to the pogo pins 62 and pads 632 provided at an end of the conductive paths 631. The paths 631 include a wiring pattern and a through hole. The pads 632 are exposed from the body 61 via the holes 612 formed in the body 61.

The body 61 may include notches for exposing the pads 632 (not shown) in place of the holes 612. The size of the body 61 may be smaller than the wiring board 63 to expose the pads 632 from the body 61.

The bottom socket 70 includes a base 71, pogo pins 72, a test antenna 73, and an attenuation member 74. The bottom socket 70 contacts the lower surface 11b of the substrate 11, to hold the DUT 10—and to connect electrically the socket 60. The base 71 in the present embodiment corresponds to an example of a "base," the test antenna 73 in the present embodiment corresponds to an example of "test antenna" and "first test antenna," and the attenuation member 74 in the present embodiment corresponds to an example of "first attenuation member" or "first attenuation sheet," in this disclosure.

The base 71 is fixed to the load board 4 by screwing, for example. The base 71 is made of an electrically insulating material such as a resin material, for example. The base 71, as shown in FIG. 4, has a flat surface 711 on its upper, holds the DUT 10 by contacting the lower surface 11b of the substrate 11 at the surface 711. Further, the base 71 includes the opening 712, through which the test antenna 73 faces the device antenna 12, of the DUT 10 when the socket 60 contacts the socket 70. The base portion 71, as shown in FIG. 5, includes holding holes 713 penetrating the base 71 in thickness direction. The pogo pins 72 are inserted into the holes 713, and the pogo pins 72 are held by the base 71. The opening 712 in the present embodiment corresponds to an example of the "second opening" or "base opening" in this disclosure.

The pogo pins 72 are the contactors that connect the pads 632 of the socket 60. The lower end of the pogo pins 72 are in contact with and electrically connected to the pads 42 of the load board 4. The upper end of the pins 72 contact the pad 632 when the socket 60 contacts the socket 70. Contacting of the pins 72 with the pads 632 the bottom socket 70 the top socket 60. This transmits a test signal sent from the tester 3 to the socket 60.

The test antenna 73, as shown in FIG. 4, is disposed inside the opening 712 of the base 71 so that the test antenna 73 faces the device antenna 12 when the top socket 60 contacts the bottom socket 70. The distance between the test antenna 73 and the device antenna 12 is adjusted so that radio waves radiated from the device antenna 12 can reach the test antenna 73 in the near-field. The test antenna 73 includes a patch antenna (microstrip antenna) and a horn antenna.

Figure 6:
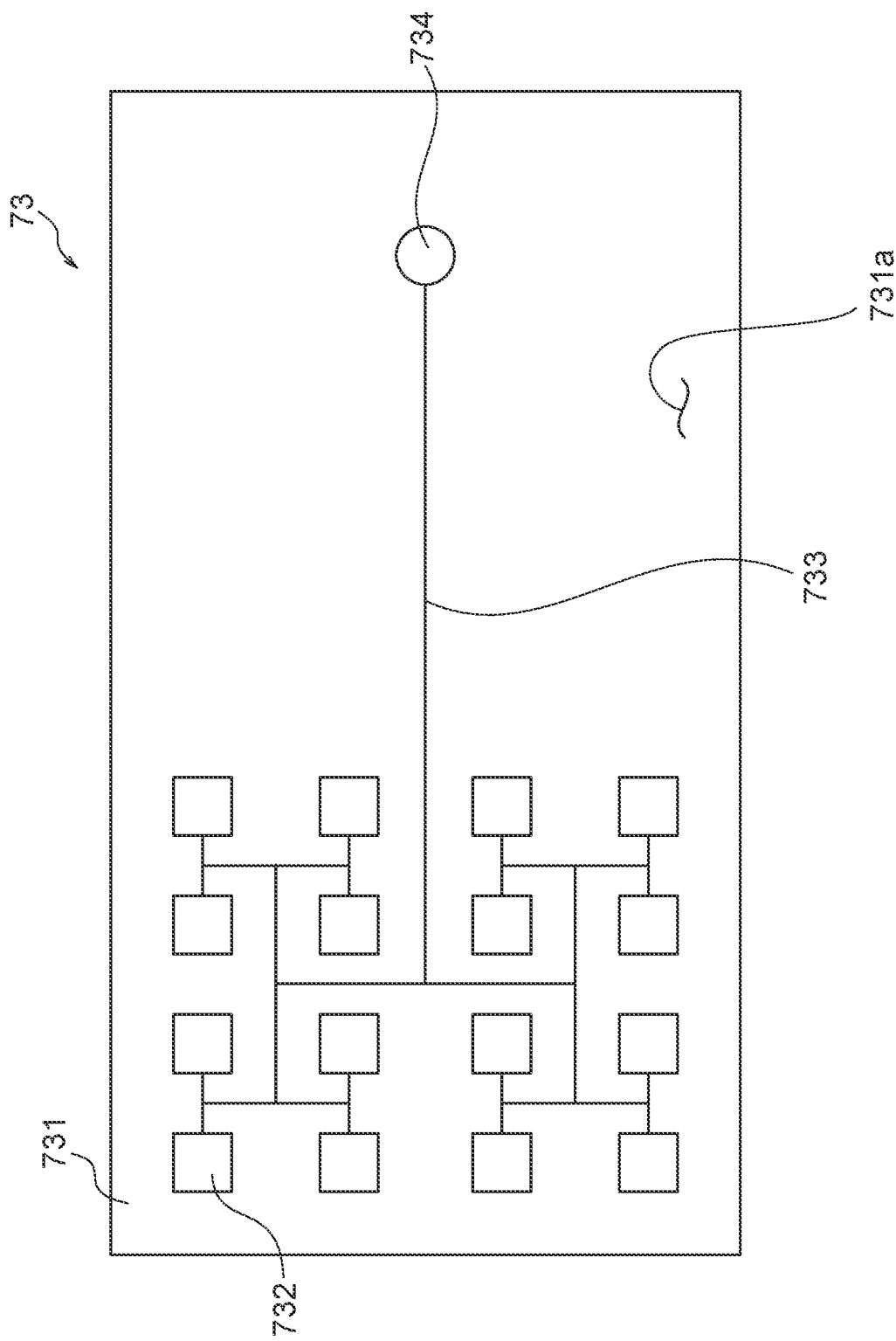
FIG. 6 is a plan view showing a test antenna according to the first embodiment of the present invention.

FIG. 6 is a plan view showing a test antenna according to the present embodiment.

As shown in FIG. 6, the test antenna 73 may include a plurality of radiating elements 732 arranged in a matrix on the upper surface 731a of the substrate 731, and one wiring pattern 733 connected to the plurality of radiating elements 732. These radiating elements 732 are formed by patterning the metal layer on the substrate 731 and connected to the signal lines of the coaxial connector 734, which are mounted on the substrate 731, via the pattern 733. In the present embodiment, the number of radiating elements 732 may be one. The plurality of radiating elements 732 are arranged in a matrix of 4 rows×4 columns, however, the number of rows and the number of columns are not limited to this. For example, the radiating elements 732 may be arranged in 8 rows×8 columns or in a row.

The wiring pattern 733 is a microstrip line, which supplies electricity to the radiating elements 732 and transmits electrical signals from the radiating elements 732 to the coaxial connector 734. The wiring pattern 733 is branched on one side and is connected to a plurality of radiating elements 732. The oilier side of the wiring pattern 733 is connected to the coaxial connector 734.

On the entire surface of the lower surface of the test antenna 73, a ground layer is formed, which is connected to a ground line of the coaxial connector 734. The coaxial connector 734 is connected to the coaxial cable 735 via another coaxial connector. The test antenna 73 is electrically connected to the tester 3 via the coaxial connector 734. A waveguide may be interposed between the antenna 73 and the tester 3 by connecting a waveguide-to-coaxial adapter to the coaxial connector 734.

The substrate 731 is fixed to the base 71 by screwing. A shim plate may also be placed between the substrate and the load board 4 to adjust the distance between the test antenna 73 and the device antenna 12. The substrate 731 in the present embodiment corresponds to an example of a "substrate," the radiating elements 732 in the present embodiment corresponds to an example of a "radiating element" or "radiator," the wiring pattern 733 in the present embodiment corresponds to an example of a "wiring pattern," in this disclosure.

The substrate 731 of the test antenna. 73 and the base 71 may be integrally formed. As a method of integrally forming the substrate 731 and the base 71, a 3D printer can be used.

Figure 7:
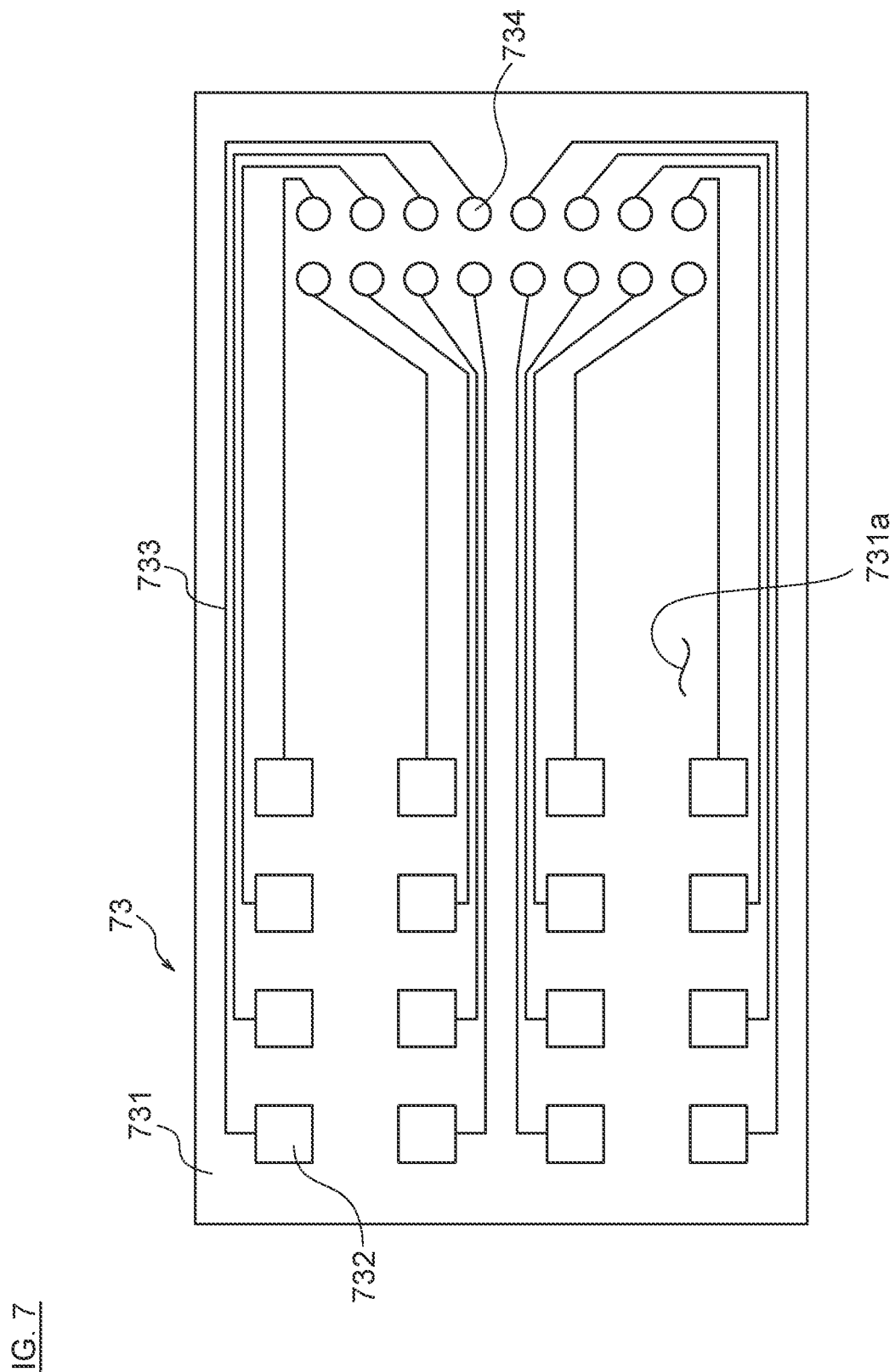
FIG. 7 is a plan view showing a modification of the test antenna according to the first embodiment of the present invention.

FIG. 7 is a plan view showing a modification of the test antenna according to the present embodiment.

The antenna 73, as shown in FIG. 7, may include a plurality of wiring patterns 733 respectively connected to a plurality of radiating elements 732. The test antenna 73 includes a plurality of radiating elements 732, a plurality of wiring patterns 733, and a plurality of coaxial connectors 734.

In the case of this modification, one end of each wiring pattern 733 is connected to the radiating element 732, the other end of each wiring pattern 733 is connected to the coaxial connector 734. Each of the wiring patterns 733 does not electrically connected each other and independent of each other. The signals sent from the respective radiating elements 732, via the wiring pattern 733, is sent to the respective coaxial connector 734 independently of the signals sent from the other radiating elements 732.

In the present modification, the signal sent from each radiating element 732 is sent to the test head 32 independently of each other since the signal does not merge in the wiring pattern 733 and coaxial the connector 734. This allows to measure the intensity of the detected radio waves for each radiating element 732, in the OTA test, and to evaluate the directivity based on the distribution of the intensity.

In the case of the modification shown in FIG. 7, the test antenna 73 includes the same number of coaxial connectors 734 as the radiating elements 732 and the wiring patterns 733 but is not particularly limited thereto. For example, the test antenna 73 may include a single coaxial connector 734 and a switch interposed between the coaxial connector 734 and the 16 wiring patterns 733. The testing apparatus 1 may perform the OTA test while switching the wiring patterns 733 that connects to the coaxial connector 734. This allows to reduce the number of the connectors 734.

Figure 8:
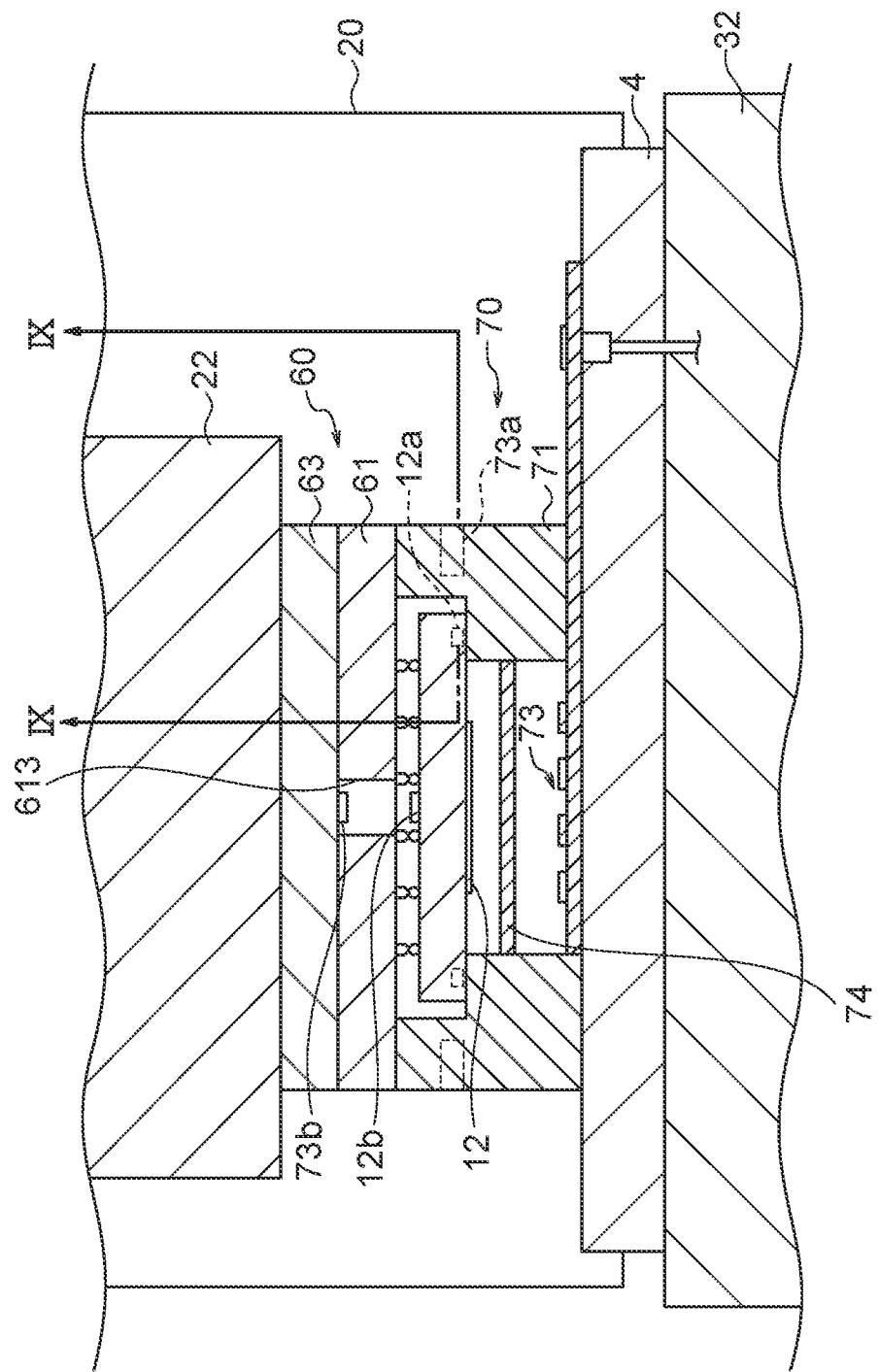
FIG. 8 is a cross-sectional view showing a first modification of the top socket and the bottom socket according to the first embodiment of the present invention.
Figure 9:
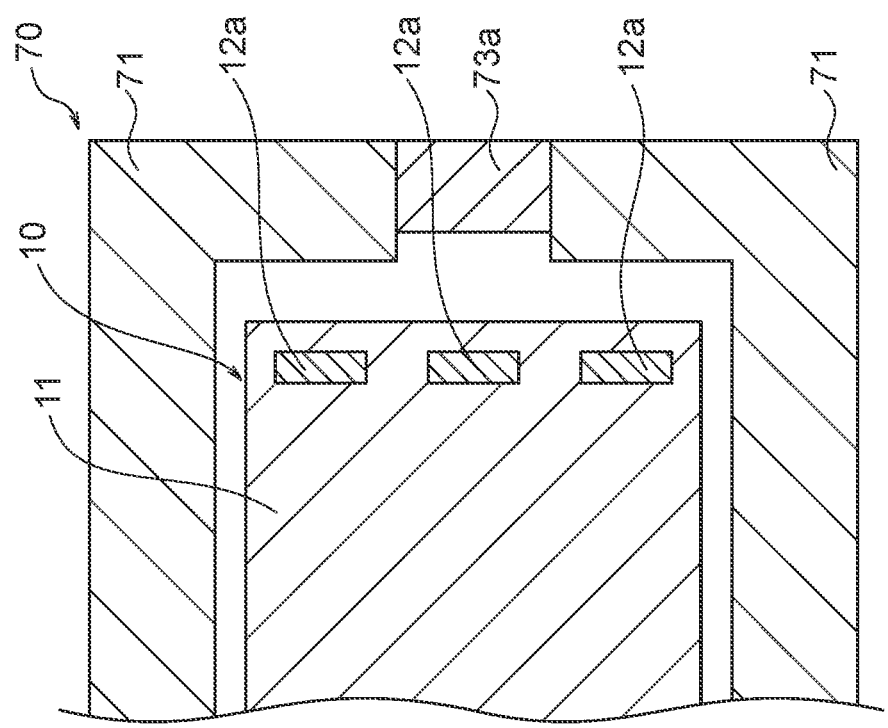
FIG. 9 is a cross-sectional view taken along IX-IX line of FIG. 8 showing a first modification of the bottom socket according to the first embodiment of the present invention.

FIG. 8 is a cross-sectional view showing a first modification of the top socket and the bottom socket according to the present embodiment, FIG. 9 is a cross-sectional view taken along IX-IX of FIG. 8 showing a first modification of the bottom socket according to the present embodiment.

The configuration of the bottom socket 70 is not particularly limited to the above. For example, as shown in FIG. 8, the DUT 10 may include a device antenna 12a provided on the side of the DUT 10 in addition to the device antenna 12 of the lower surface 11b. In this case, as shown in FIGS. 8 and 9, the bottom socket 70 may include a test antenna 73a in addition to the test antenna 73. The test antenna 73a is disposed substantially parallel to the lower surface 11b with respect to the device antenna 12a. This allows to test the antenna 12a that radiates radio waves in a direction parallel to the lower surface 11b. As such a device antenna 12a, for example, a dipole antenna can be exemplified. The test antenna 73a is also electrically connected to the tester 3, similarly to the test antenna 73 described above. The device antenna 12a in the present embodiment corresponds to an example of the "second device antenna" in this disclosure.

The bottom socket 70 may include only the test antenna 73a and not include the antenna 73 if the DUT 10 does not include the device antenna 12 and includes only the device antenna 12a.

As shown in FIG. 8, a test antenna 73b may be disposed on the wiring board 63 of the top socket 60 if the DUT 10 include a device antenna 12b on the surface opposite to the device antenna 12. In this case, the body 61 includes the opening 613 so that the test antenna 73b faces the device antenna 12. This allows to perform the OTA test for each device antenna provided on both sides of the substrate 11.

Returning to FIG. 4, the attenuation member 74 is provided inside the opening 712 of the base 71 and interposed between the test antenna 73 and the device antenna 12. The attenuation member 74 is a sheet-like member made of a material capable of absorbing radio waves, particularly millimeter waves. As the material of the attenuation member 74, the same material as the material constituting the radio wave absorbing material used for the inner wall of the radio wave dark room can be used, and specifically, ferrite, a resin material, and the like can be exemplified. Changing the content and the dielectric constant of the wave absorbing material of the attenuation member 74 may adjust the amount of attenuation of the radio wave by the attenuation member 74. Adjusting the thickness of the attenuation member 74 may adjust the amount of the attenuation of radio waves.

The attenuation member 74 is provided inside the opening 712 of the base 71 to face the radiating elements 732 of the test antenna 73, in the present embodiment, the attenuation member 74, in a plan view (when viewed along the vertical direction), closes the opening 712 and covers the entire surface of the radiating elements 732. The attenuation member 74, in a state where the DUT 10 is in contact with the base 71, is disposed so as to face the device antenna 12 of the DUT 10, and is disposed so as to be interposed between the radiating elements 732 and the device antenna 12.

Although not particularly shown, in the present embodiment, the attenuation member 74 is fitted into a groove formed on the inner surface of the three sides of the opening 712 and is connected to the fixing member via an opening formed in the remaining one inner surface. Screwing the fixing member to the outer surface of the base 71 fixes the attenuation member 74 to the base 71. Alternatively, an adhesive may be used to fix the attenuation member 74 to the base 71.

The attenuation member 74 interposed between the radiating elements 732 and the device antenna 12, while maintaining the distance on the radio communication between the test antenna 73 and the device antenna 12, allows to shorten the actual distance between the test antenna 73 and the device antenna 12. This allows to reduce the size of the socket 5.

Further, the attenuation member 74 interposed between the radiating elements 732 and the device antenna 12, while maintaining the actual distance between the test antenna 73 and the device antenna 12, also allows to increase the distance on the radio communication between the test antenna 73 and the device antenna 12. This allows to restrain the test antenna 73 and the device antenna 12 from interfering with each other to deteriorate the accuracy of the test.

Figure 10:
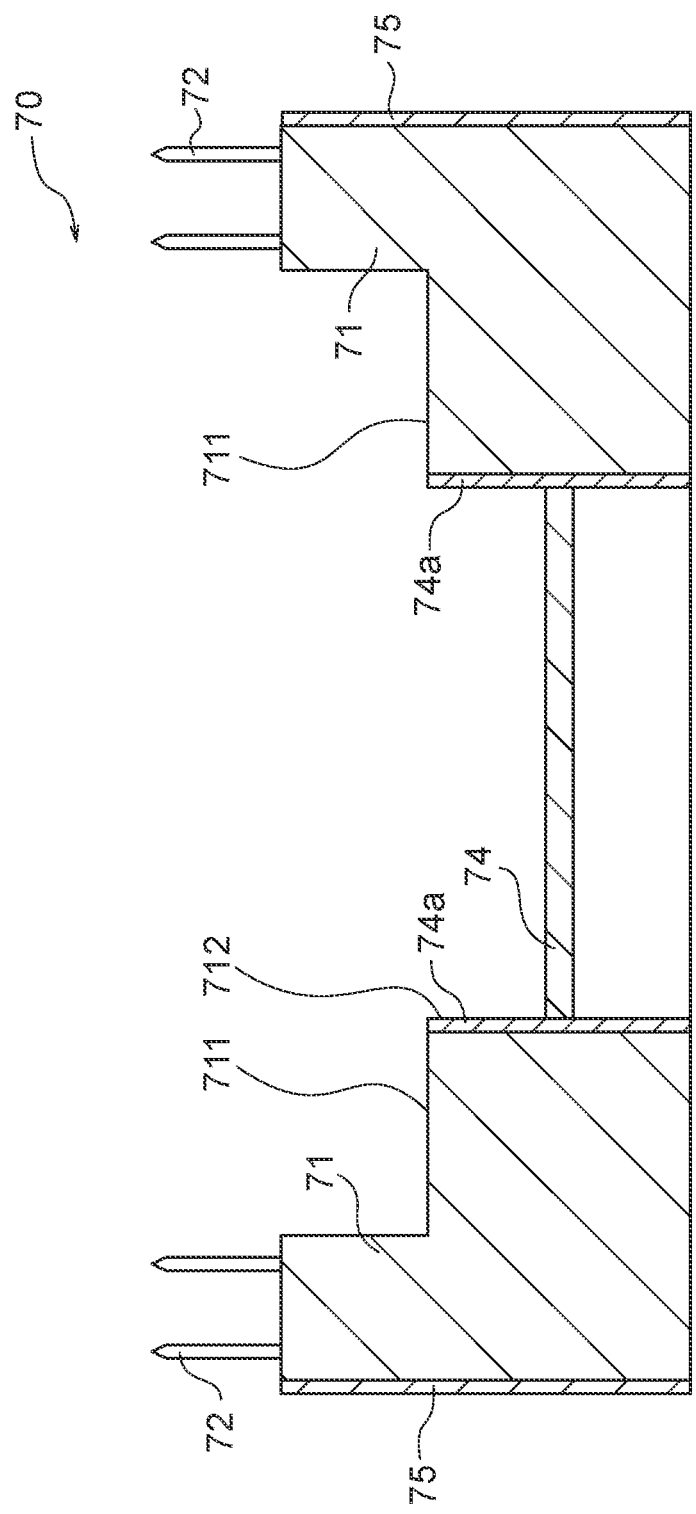
FIG. 10 is a cross-sectional view showing a second modification of the bottom socket in the first embodiment of the present invention.

FIG. 10 is a cross-sectional view showing a second modification of the bottom socket according to the present embodiment.

The bottom socket 70, as shown in FIG. 10, may include an attenuation member 74a provided on the inner surface of the opening 712 and a shield layer 75 provided on the outer surface of the base 71. The attenuation member 74a in the present embodiment corresponds to an example of the "second attenuation member" or "second attenuation sheet," and the shield layer 75 in the present embodiment corresponds to an example of the "shield layer," in this disclosure.

The attenuation member 74a attenuates the radio waves radiated from the device antenna 12 or the test antenna 73 and suppress the reflection of the radio waves. This allows to improve the accuracy of the test. The attenuation member 74a is composed of the same material as the attenuation member 74.

The shield layer 75 is provided on the outer surface of the base 71, that is, the DUT 10 is surrounded by the shield layer 75 when the DUT 10 contacts the surface 711 of the base 71. This allows to shield the radio waves from the outside, thus, to improve the accuracy of the test.

Instead of providing the shield layer 75, the base 71 may have a radio wave blocking function itself by constituting the base 71 with a conductive material such as a metal, in this case, an insulator is interposed between the inner surface of the holes 713 of the base 71 and the pins 72.

Hereinafter, the OTA test of the DUT 10 by the electronic component testing apparatus 1 in the present embodiment will be described with reference to FIGS. 2 to 4.

First, starting the chamber 20, adjusting the temperature in the chamber 20 to a predetermined temperature.

Next, as shown in FIG. 2, the contact chuck 22 of the handler 2 moves by the contact arm 21 right above the DUT 10. Thereafter, the contact chuck 22 goes down toward the DUT 10, the pogo pins 62 of the top socket 60 contact the input and output terminals 14 of the DUT 10, the suction pad 25 contacts the DUT 10. At this time, the DUT 10 is held in the contact chuck 22 in a posture inverted from the normal posture (in which the input-output terminal 14 faces upward).

Next, by sucking air from the suction pipe 24, the contact chuck 22 sucks and holds the DUT 10. Then, as shown in FIG. 3, the DUT 10 moves right above the bottom socket 70 by the arm 21.

Then, as shown in FIG. 4, the chuck 22 goes down by the arm 21 to press the DUT 10 against the bottom socket 70. Thus, the lower surface 11b of DUT 10 contacts the surface 711 of the base 71 and the device antenna 12 faces the test antenna 73. Also, at the same time the pogo pins 72 of the bottom socket 70 contact the pads 632 of the top socket 60, the DUT 10 is electrically connected to the test head 32 via the bottom socket 70 and the top socket 60.

Then, while pressing the top socket 60 to the DUT 10 with pressing the DUT 10 to the bottom socket 70, the testing apparatus 1 performs the following test for determining the radio wave reception characteristics of the DUT 10.

Specifically, first, the test signal outputted from the main frame 31 is sent to the DUT 10 through the conductive path 41 of the load board 4 mounted on the test head 32, the pogo pins 72, the conductive path 631, and the pogo pins 62. Then, the DUT 10 receiving the test signal radiates radio waves downward from the device antenna 12. This radio wave is received by the test antenna 73, is converted into an electric signal, and is sent to the main frame 31 via the coaxial connector 734. The radio wave radiation properties of the DUT 10 is evaluated based on the signal.

Then, while keeping the DUT 10 pressed against the bottom socket 70, the test signal outputted from the main frame 31 is sent to the test antenna 73 via the coaxial connector 734. The test antenna 73 which has received the test signal radiates radio waves upward. This radio wave is received by the device antenna 12, is converted into an electric signal, and is sent to the main frame 31 via the top socket 60, the bottom socket 70, and the load board 4. The radio wave reception characteristics of the DUT 10 is evaluated based on the signal.

After the DUT 10 has been evaluated, the contact arm 21 moves upwards and the DUT 10 moves away from the bottom socket 70. This completes the DUT 10 test.

As described above, in this embodiment, the bottom socket 70 for holding the DUT 10 includes the antenna 73 disposed to face the device antenna 12 of the DUT 10. Contacting of the lower surface 11*b* of the DUT 10 with the surface 711 of the bottom socket 70 positions the device antenna 12 and the test antenna 73 such that the radio waves from the device antenna 12, reach the test antenna 73 in near-field. This allows to perform the OTA test in near-field.

If the contact chuck of the handier includes the test antenna, a detachable connector is interposed between the test antenna and the test head. Attaching and detaching the connector every time the test may impair the connection reliability.

In contrast, in the present embodiment, the test antenna 73 is disposed on the bottom socket 70 on the load board 4 and is electrically connected to the test head 32 via the coaxial connector 734. This allows to stably transmit the signal to the tester 3, thus improve the accuracy of the test.

Furthermore, in this embodiment, the attenuation member 74 interposed between the test antenna 73 and the device antenna 12, while maintaining the distance on the radio communication between the test antenna 73 and the device antenna 12, shortens the actual distance between the test antenna 73 and the device antenna 12. This allows to reduce the size of the socket 5.

Figure 11:
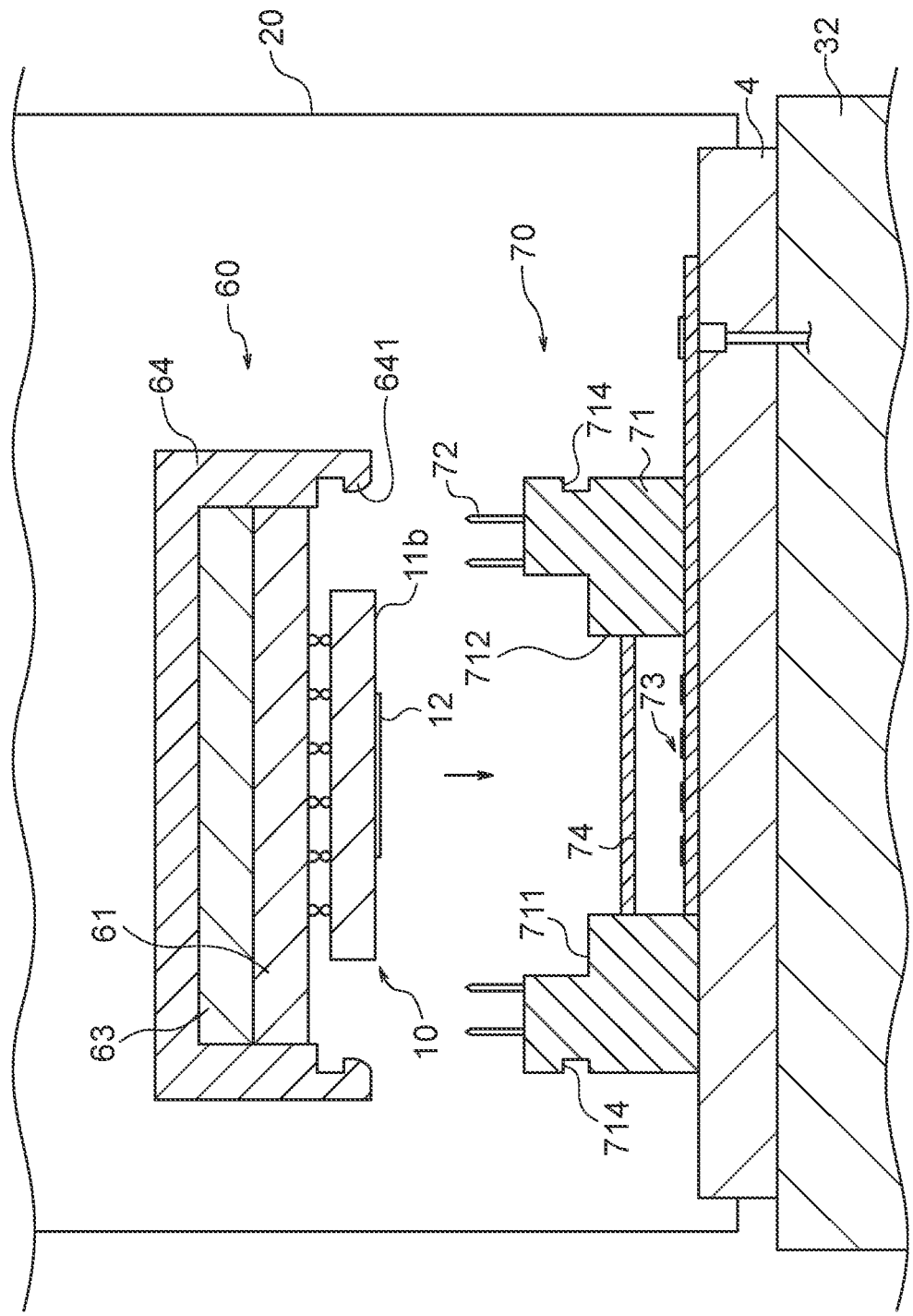
FIG. 11 is a cross-sectional view showing a modification of the electronic component testing apparatus according to the first embodiment of the present invention.

FIG. 11 is a cross-sectional view showing a modification of the electronic component testing apparatus according to the present embodiment.

In the present embodiment, the testing apparatus 1 includes the handler 2, but the electronic component testing apparatus 1 may be a so-called manual type testing apparatus that does not include the handler 2. In this case, as shown in FIG. 11, the top socket 60 includes a socket cover 64 that is fitted to the bottom socket 70, the base 71 includes a recess 714 for engaging the socket cover 64. The socket cover 64 includes a latch 641 for engaging the recess 714. Engaging the latch 641 and the recess 714 fixes the top socket 60 to the bottom socket 70. The socket cover 64 makes it possible to fix the top socket 60 to the bottom socket 70 without using the handler 2 and press the DUT 10 against the bottom socket 70. This makes the device antenna 12 to face the test antenna 73 and electrically connect the top socket 60 to the bottom socket 70, thus, perform the OTA test in near-field.

The Second Embodiment

Figure 12:
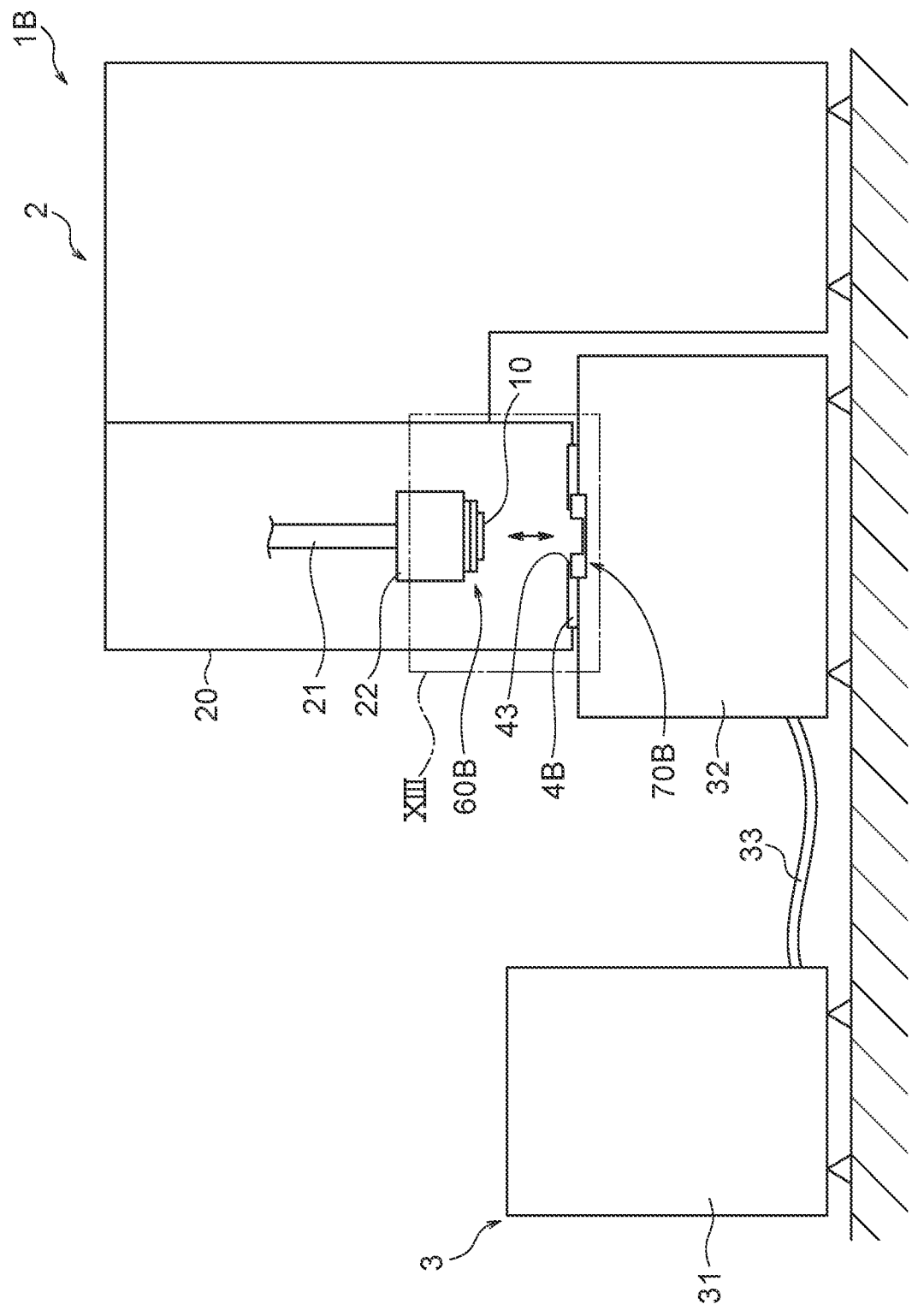
FIG. 12 is a schematic cross-sectional view showing the overall configuration of the electronic component test apparatus according to the second embodiment of the present invention.

FIG. 12 is a schematic cross-sectional view showing the overall configuration of the electronic component testing apparatus according to the present embodiment.

The electronic component testing apparatus 113 according to the present embodiment differs from the first embodiment in the configuration of the load board 4B, the top socket 60B, and the bottom socket 70B, but is otherwise similar. Hereinafter, only the different components between the electronic component testing device 113 in the second embodiment and the first embodiment will be described. The same components as those in the first embodiment are assigned to the same reference numerals and omit the descriptions.

The load board 4B in the present embodiment, as shown in FIG. 12, includes an opening 43 in which the bottom socket 70B is fitted. Through the opening 43, the DUT 10 held by the contact chuck 22 can contact the bottom socket 70B. The opening 43 in the present embodiment corresponds to an example of the "first opening" or "board opening" in this disclosure.

Figure 13:
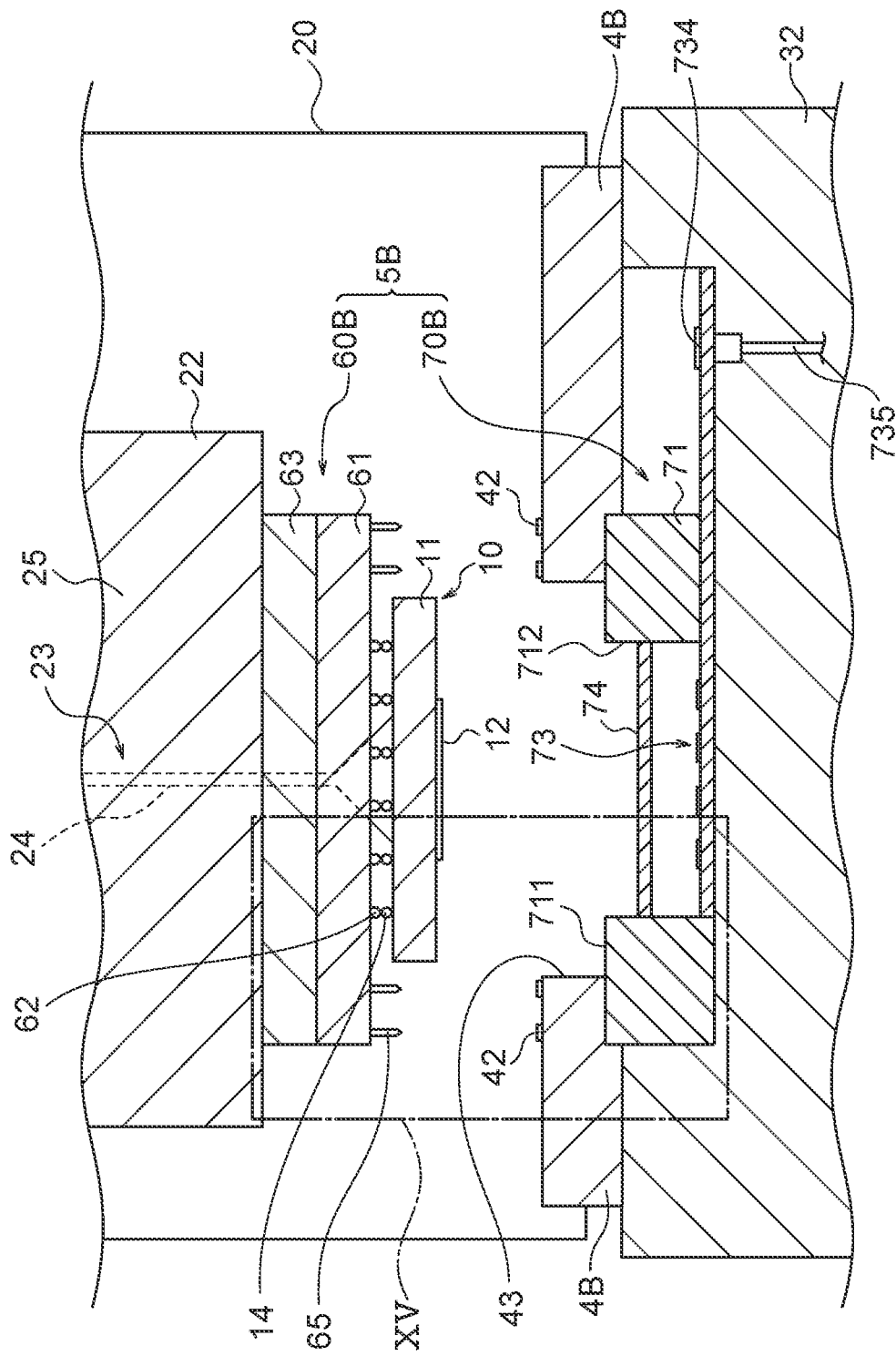
FIG. 13 is an enlarged cross-sectional view of XIII portion of FIG. 12 showing pressing the DUT to the socket according to the second embodiment of the present invention.
Figure 14:
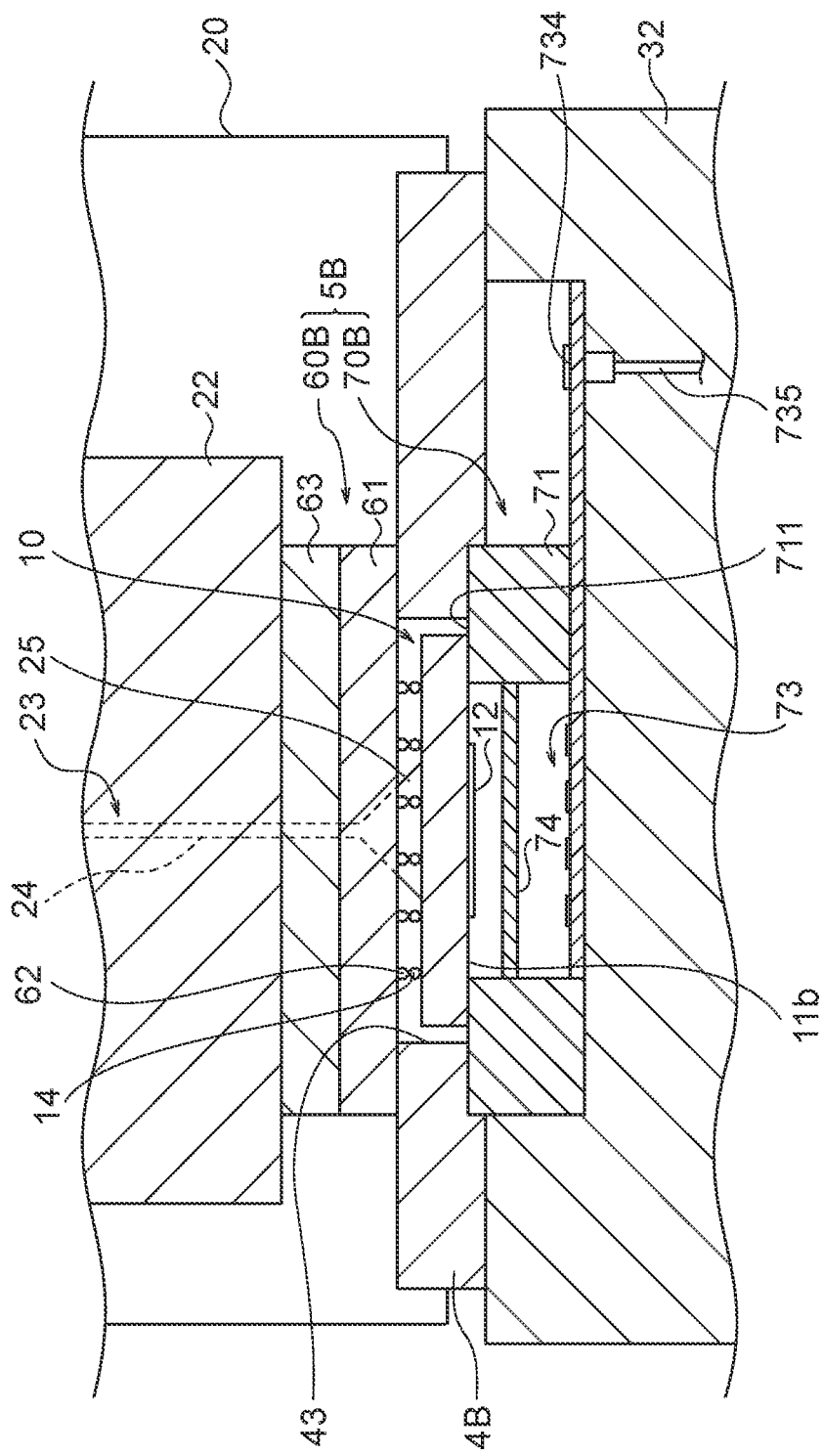
FIG. 14 shows pressing the DUT to the socket according to the second embodiment of the present invention and corresponds to FIG. 13.
Figure 15:
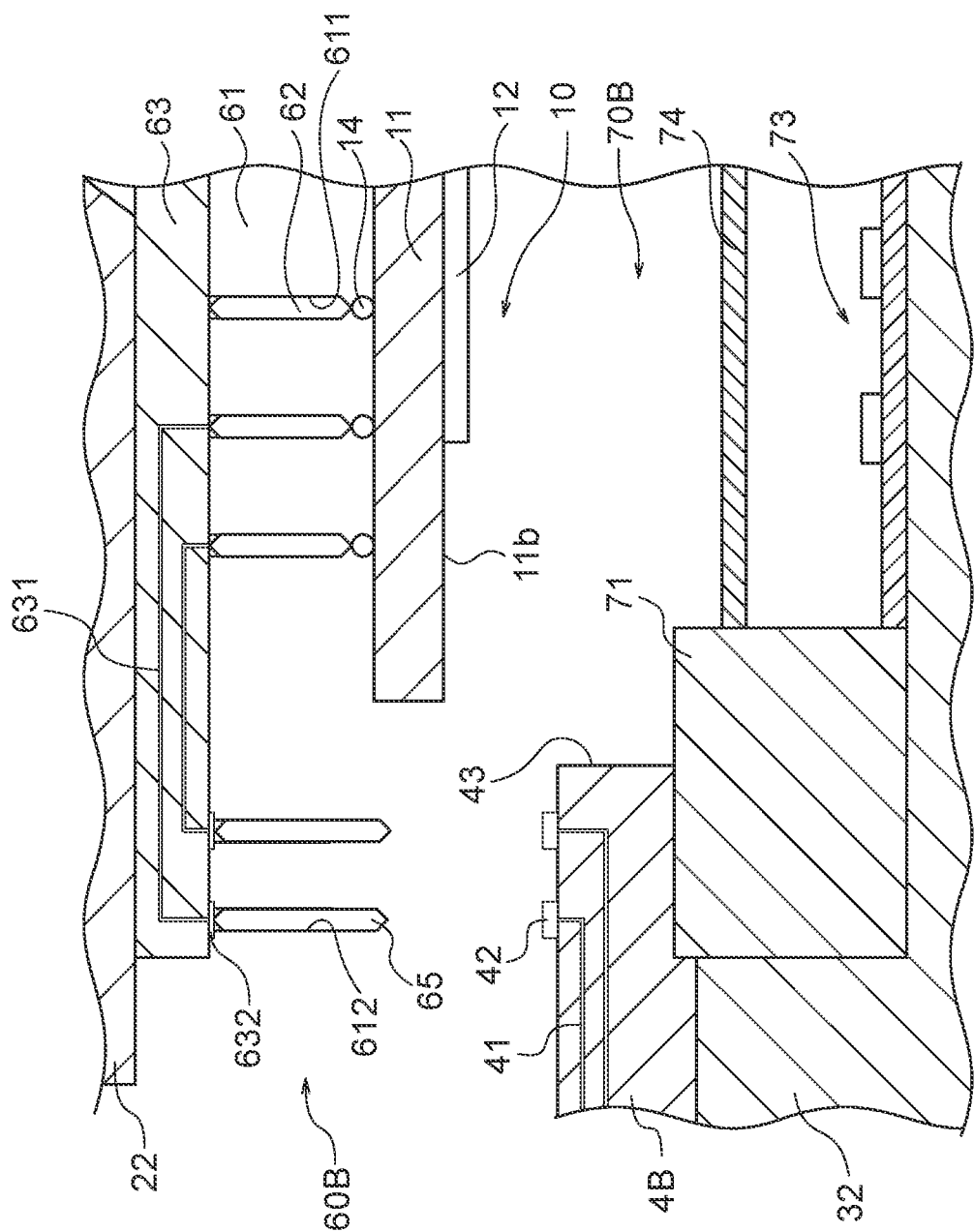
FIG. 15 is an enlarged cross-sectional view of the XV portion of FIG. 13.

FIG. 13 is an enlarged cross-sectional view of XIII portion of FIG. 12 showing pressing the DUT to the socket according to the present embodiment, FIG. 14 shows pressing the DUT to the socket according) the present embodiment and corresponds to FIG. 13, FIG. 15 is an enlarged cross-sectional view of the XV portion of FIG. 13.

The top socket 60B, as shown in FIG. 13, includes pogo pins 65 provided corresponding to the pads 42 of the load board 4B. The pogo pins 65, as shown in FIG. 15, are disposed inside the through holes 612 of the body 61B, held in the body 61B, and in contact with the pads 632. The pogo pins 65 contact the pads 42 by contacting of the DUT 10 with the bottom socket 70B (refer to FIG. 14) and allows to electrically connect the top socket 60B to the load board 4B.

As shown in FIG. 13, the bottom socket 70B are embedded in the load board 4B and the test head 32. The bottom socket 70B is exposed from the load board 4B through the opening 43. This allows the test antenna 73 to face the device antenna 12 through the opening 43.

The bottom socket 70B, unlike the bottom socket in the first embodiment, does not include a pogo pin electrically connected to the tester 3. In the present embodiment, the test signal sent from the tester 3 is transmitted from the pads 42 of the load board 4B to the DUT 10 via the pogo pins 65 of the top socket 60B, not via the bottom socket 70B. In the present embodiment, the load board 4B is also replaced in accordance with a change in the type of the DUT 10, in addition to the top socket 60B and the bottom socket 70B. That is, the socket 5B is composed of the top socket 60B, the bottom socket 70B and the load board 4B. The load board 4B is detachably fixed to the test head 32 via a connector or the like.

The testing apparatus 1B can perform the OTA test of the DUT 10 in the same manner as the OTA test in the first embodiment. In the present embodiment, the test signal sent from the tester 3 is transmitted to the DUT 10 through the test head 32, the load board 4B, and the top socket 60B.

As described above, in the present embodiment, the bottom socket 70B for holding the DUT 10 includes a test antenna 73 disposed to face the device antenna 12. Contacting of the lower surface 11b with the surface 711 positions the device antenna 12 and the test antenna 73 such that the radio waves from the device antenna 12 reach the test antenna 73 in near-field. This allows to perform the OTA test in near-field.

Further, similarly to the first embodiment, the attenuation member 74 interposed between the test antenna 73 and the device antenna 12, while maintaining the distance on the radio communication between the test antenna 73 and the device antenna 12, allows to relatively shorten the actual distance between the test antenna 73 and the device antenna 12. This allows to reduce the size of the socket 5B.

Embodiments heretofore explained are described to facilitate understanding of the present invention and are not described to limit the present invention. It is therefore intended that the elements disclosed in the above embodiments include all design changes and equivalents to fall within the technical scope of the present invention.

For example, in the above-described embodiments, the electronic component testing apparatus tests both the radio wave emission characteristic and the radio wave reception characteristic of the DUT, but in some embodiments, the electronic component testing apparatus may test only one of the radio wave emission characteristic and the radio wave reception characteristic of the DUT as a test of the DUT.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS 1,1B . . . Electronic component testing apparatus
2 . . . Handler
20 . . . Thermostatic chamber
21 . . . Contact arm
22 . . . Contact chuck
23 . . . Adsorption mechanism
24 . . . Suction pipe
25 . . . Suction pad
26 . . . Vacuum pump
3 . . . Tester
31 . . . Main frame
32 . . . Test head
33 . . . Cable
4,4B . . . Load board
41 . . . Conductive path
42 . . . Pad
43 . . . Opening
5,5B . . . Socket
60, 60B . . . Top socket
61 . . . Body
611 . . . Holding hole
612 . . . Through hole
613 . . . Opening
62 . . . Pogo pin
63 . . . Wiring board
631 . . . Conductive path
632 . . . Pad
64 . . . Socket cover
65 . . . Pogo pin
70, 70B . . . Bottom socket
71,71 . . . Base
711 . . . Surface
712 . . . Opening
713 . . . Holding hole
714 . . . Recess
72 . . . Pogo pin
73, 73a, 73b . . . Testa
731 . . . Substrate
732 . . . Radiating element
733 . . . Wiring pattern
734 . . . Coaxial connector
735 . . . Coaxial cable
74, 74a . . . Attenuation member
75 . . . Shield layer
10 . . . DUT
12, 12a, 12b . . . Device antenna
13 . . . Semiconductor chip
14 . . . Input-output terminal

What is claimed is:

1. An electronic component testing apparatus for testing a device under test (DUT), the electronic component testing apparatus comprising:
a socket unit that is electrically connected to the DUT; a; and
a tester that comprises a test head in which the first wiring board is mounted, wherein
the socket unit comprises:
a first socket that faces a first main surface of the DUT and is electrically connected to the DUT; and
a second socket that:
is mounted on the first wiring board,
contacts a second main surface of the DUT on a side opposite to the first main surface,
is electrically connected to the first socket, and comprises:
a base that contacts the second main surface; and
a test antenna unit that is electrically connected to the tester, faces a device antenna unit of the DUT, and is fixed to the base, and
the first socket moves relative to the first wiring board,
the positional relationship between the device antenna and the test antenna is set such that radio waves from the device antenna reach the test antenna within a near field in a state that the second main surface of the DUT contacts the base of the second socket, and
the tester tests the DUT by transmitting and receiving radio waves between the device antenna unit and the test antenna unit while the DUT is electrically connected to the first socket and the first socket is electrically connected to the test head through the second socket.

2. The electronic component testing apparatus according to claim 1, wherein
the second socket further comprises:
a first attenuation sheet that is interposed between the test antenna unit and the device antenna unit and attenuates radio waves radiated from the device antenna unit or the test antenna unit.

3. The electronic component testing apparatus according to claim 1, wherein
the device antenna unit comprises a first device antenna disposed on the second main surface,
the test antenna unit comprises a first test antenna facing the first device antenna, and
the base comprises a base opening through which the first test antenna faces the first device antenna.

4. The electronic component testing apparatus according to claim 3, wherein
the second socket further comprises:
a second attenuation sheet that is disposed on an inner surface of the base opening and attenuates radio waves radiated from the first device antenna or the first test antenna; and
a shield layer that is disposed on an outer surface of the base and shields radio waves from the outside.

5. The electronic component testing apparatus according to claim 1, wherein the first test antenna is a patch antenna comprising:
a substrate;
a radiator that is disposed on the substrate; and
a wiring pattern that is disposed on the substrate and connected to the radiator.

6. The electronic component testing apparatus according to claim 1, wherein
the device antenna unit comprises a second device antenna that is disposed on a side of the DUT, and
the test antenna unit comprises a second test antenna that faces the second device antenna and is disposed along a direction parallel to the first main surface of the DUT.

7. The electronic component testing apparatus according to claim 1, further comprising:
an electronic component handling apparatus that comprises:
a moving device that:
holds and moves the DUT, and
presses the DUT against the socket unit.

8. The electronic component testing apparatus according to claim 7, wherein
the moving device comprises:
a holder that comprises an adsorption mechanism that holds the DUT, and
the first socket is attached to a tip end of the holder.

9. A socket unit used for testing a device under test (DUT), the socket unit comprising:
a first socket that faces a first main surface of the DUT and is electrically connected to the DUT; and
a second socket that:
contacts a second main surface of the DUT on a side opposite to the first main surface,
is electrically connected to the first socket, and
comprises:
a base that contacts the second main surface; and
a test antenna unit that faces a device antenna unit of the DUT and is fixed to the base, and
the positional relationship between the device antenna and the test antenna is set such that radio waves from the device antenna reach the test antenna within a near field in a state that the second main surface of the DUT contacts the base of the second socket.

10. The socket unit according to claim 9, wherein
the second socket further comprises:
a first attenuation sheet that is interposed between the test antenna unit and the device antenna unit and attenuates radio waves radiated from the device antenna unit or the test antenna unit.

11. The socket unit according to claim 9, wherein
the device antenna unit comprises a first device antenna disposed on the second main surface,
the test antenna unit comprises a first test antenna facing the first device antenna, and
the base comprises a base opening through which the first test antenna faces the first device antenna.

12. A socket unit used for testing a device under test (DUT), the socket unit comprising:
a first socket that faces a first main surface of the DUT and is electrically connected to the DUT;
a second socket that contacts a second main surface of the DUT on a side opposite to the first main surface; and
a first wiring board that comprises a board opening exposing the second socket and that is electrically connected to the first socket, wherein
the second socket comprises:
a base that contacts the second main surface; and
a test antenna unit that faces a device antenna unit of the DUT and is fixed to the base, and
the positional relationship between the device antenna and the test antenna is set such that radio waves from the device antenna reach the test antenna within a near field in a state that the second main surface of the DUT contacts the base of the second socket.

13. The socket unit according to claim 12, wherein
the second socket further comprises:
a first attenuation sheet that is interposed between the test antenna unit and the device antenna unit and attenuates radio waves radiated from the device antenna unit or the test antenna unit.

14. The socket unit according to claim 12, wherein
the device antenna unit comprises a first device antenna disposed on the second main surface,
the test antenna unit comprises a first test antenna facing the first device antenna, and
the base comprises a base opening through which the first test antenna faces the first device antenna.

15. A replacement component for an electronic component testing apparatus for testing a device under test (DUT), the replacement component comprising:
a base that contacts the second main surface on a side of the DUT opposite to a first main surface of the DUT; and
a first test antenna that faces a device antenna unit of the DUT, wherein
the base comprises a base opening through which the first test antenna faces the first device antenna and is fixed to the base, and
the positional relationship between the device antenna and the test antenna is set such that radio waves from the device antenna reach the test antenna within a near field in a state that the second main surface of the DUT contacts the base of the second socket.

16. The replacement component according to claim 15 further comprising:
a first attenuation sheet that is disposed in the base opening to be interposed between the first test antenna and the device antenna unit, and attenuates radio waves radiated from the device antenna unit or the first test antenna.

* * * * *